(12) United States Patent
Zhou et al.

(10) Patent No.: US 10,461,097 B2
(45) Date of Patent: Oct. 29, 2019

(54) ARRAY SUBSTRATE AND METHOD OF MANUFACTURING THE SAME

(71) Applicant: Shenzhen China Star Optoelectronics Technology Co., Ltd., Shenzhen, Guangdong (CN)

(72) Inventors: Zhichao Zhou, Guangdong (CN); Hui Xia, Guangdong (CN)

(73) Assignee: Shenzhen China Star Optoelectronics Technology Co., Ltd, Shenzhen, Guangdong (CN)

( * ) Notice: Subject to any disclaimer, the term of this patent is extended or adjusted under 35 U.S.C. 154(b) by 315 days.

(21) Appl. No.: 15/115,254

(22) PCT Filed: Jul. 11, 2016

(86) PCT No.: PCT/CN2016/089601
§ 371 (c)(1),
(2) Date: Jul. 28, 2016

(87) PCT Pub. No.: WO2017/206269
PCT Pub. Date: Dec. 7, 2017

(65) Prior Publication Data
US 2018/0182782 A1   Jun. 28, 2018

(30) Foreign Application Priority Data

Jun. 1, 2016   (CN) .......................... 2016 1 0379712

(51) Int. Cl.
*H01L 29/04* (2006.01)
*H01L 27/12* (2006.01)
(Continued)

(52) U.S. Cl.
CPC ........ *H01L 27/1222* (2013.01); *G02F 1/1368* (2013.01); *G02F 1/136286* (2013.01);
(Continued)

(58) Field of Classification Search
CPC ........... H01L 27/1222; H01L 21/02532; G02F 1/136286
See application file for complete search history.

(56) References Cited

U.S. PATENT DOCUMENTS

2016/0020227 A1   1/2016   Choi et al.
2018/0040632 A1   2/2018   Zhang et al.

FOREIGN PATENT DOCUMENTS

CN   101097871 A   1/2008
CN   105448823 A   3/2016

*Primary Examiner* — Samuel A Gebremariam
(74) *Attorney, Agent, or Firm* — Andrew C. Cheng

(57) ABSTRACT

The present application discloses an array substrate and a method of manufacturing the same. The array substrate includes a first insulating layer disposed on the substrate; a source electrode pattern disposed within the first insulating layer; an annular gate electrode pattern disposed on the first insulating layer and surrounded the periphery of the source electrode pattern; a second insulating layer covering on the annular gate electrode pattern; a semiconductor pattern disposed in the annular area of the annular gate electrode pattern, and is electrically connected to the exposed portion of the source electrode pattern, the semiconductor pattern is further electrical insulation to the annular gate electrode pattern through the second insulating layer; a pixel electrode disposed on the second insulating layer and electrically connected to a side of the semiconductor pattern remote from the substrate.

9 Claims, 8 Drawing Sheets

(51) Int. Cl.
  *H01L 21/77*  (2017.01)
  *G02F 1/1362*  (2006.01)
  *G02F 1/1368*  (2006.01)
  *H01L 21/02*  (2006.01)
  *H01L 29/417*  (2006.01)
  *H01L 29/423*  (2006.01)
  *H01L 29/66*  (2006.01)
  *H01L 29/786*  (2006.01)
  *G02F 1/1343*  (2006.01)

(52) U.S. Cl.
  CPC .... *H01L 21/0262* (2013.01); *H01L 21/02532* (2013.01); *H01L 21/02592* (2013.01); *H01L 21/77* (2013.01); *H01L 27/12* (2013.01); *H01L 27/124* (2013.01); *H01L 27/127* (2013.01); *H01L 27/1262* (2013.01); *H01L 29/41733* (2013.01); *H01L 29/42376* (2013.01); *H01L 29/42384* (2013.01); *H01L 29/66765* (2013.01); *H01L 29/78669* (2013.01); *G02F 1/13439* (2013.01); *G02F 2001/136295* (2013.01); *G02F 2202/103* (2013.01)

ARRAY SUBSTRATE AND METHOD OF MANUFACTURING THE SAME

FIELD OF THE INVENTION

The present application relates to an array substrate technology field, and more particularly to an array substrate and method of manufacturing the same.

BACKGROUND OF THE INVENTION

In the liquid crystal panel industry, the bottom gate structure is usually adapted in the current array substrate, and the on-state current of the bottom gate structure is heavily depend on the width to length ratio of the channel. Due to the limited of the manufacturing conditions of the current array substrate, a length of the channel to reach within the level of 5 micrometer, it has been very difficult to narrow, and some of the aperture ratio would sacrifice by increasing the width of the channel. Thus, the width to length ratio of the channel in the conventional technology cannot be increased; thereby the on-state current of the bottom gate structure cannot be increased.

SUMMARY OF THE INVENTION

The embodiment of the present application discloses an array substrate and method of manufacturing the same to solve the problem mentioned above.

In order to achieve the above function, a technology approach adapted in the present application is: providing an array substrate, includes:

a substrate;

a first insulating layer disposed on the substrate;

a source electrode pattern disposed within the first insulating layer;

an annular gate electrode pattern disposed on the first insulating layer and surrounded the periphery of the source electrode pattern;

a second insulating layer covering on the annular gate electrode pattern, wherein a side of the source electrode pattern remote from the substrate is at least partially exposed through the first insulating layer and the second insulating layer;

a semiconductor pattern disposed in the annular area of the annular gate electrode pattern, and is electrically connected to the exposed portion of the source electrode pattern, the semiconductor pattern is further electrical insulation to the annular gate electrode pattern through the second insulating layer;

a pixel electrode disposed on the second insulating layer and electrically connected to a side of the semiconductor pattern remote from the substrate;

a data line electrically connected to the source electrode pattern, wherein the first insulating layer including a buffer layer and a passivation layer, the data line is formed within the buffet layer and covered by the passivation layer; and wherein the source electrode pattern including a first source electrode pattern layer and a second source electrode pattern layer stacked disposed, the first source electrode pattern layer and the data line are formed by the same material, the second source electrode pattern layer and the annular gate electrode pattern are formed by the same material.

Wherein the array substrate further including a scanning line electrically connected to the annular gate electrode pattern, and the second insulating layer further covering on the scanning line.

Wherein the semiconductor pattern is in direct contact with the exposed portion of the source electrode pattern.

Wherein the pixel electrode is in direct contact with the side of the semiconductor pattern remote from the substrate.

In order to achieve the above function, a technology approach adapted in the present application is: providing an array substrate, includes:

a substrate;

a first insulating layer disposed on the substrate;

a source electrode pattern disposed within the first insulating layer;

an annular gate electrode pattern disposed on the first insulating layer and surrounded the periphery of the source electrode pattern;

a second insulating layer covering on the annular gate electrode pattern, wherein a side of the source electrode pattern remote from the substrate is at least partially exposed through the first insulating layer and the second insulating layer;

a semiconductor pattern disposed in the annular area of the annular gate electrode pattern, and is electrically connected to the exposed portion of the source electrode pattern, the semiconductor pattern is further electrical insulation to the annular gate electrode pattern through the second insulating layer; and a pixel electrode disposed on the second insulating layer and electrically connected to a side of the semiconductor pattern remote from the substrate.

Wherein the array substrate further including a data line electrically connected to the source electrode pattern, wherein the first insulating layer including a buffer layer and a passivation layer, the data line is formed within the buffet layer and covered by the passivation layer.

Wherein the source electrode pattern including a first source electrode pattern layer and a second source electrode pattern layer stacked disposed, the first source electrode pattern layer and the data line are formed by the same material, the second source electrode pattern layer and the annular gate electrode pattern are formed by the same material.

Wherein the array substrate further including a scanning line electrically connected to the annular gate electrode pattern, and the second insulating layer further covering on the scanning line.

Wherein the semiconductor pattern is in direct contact with the exposed portion of the source electrode pattern.

Wherein the pixel electrode is in direct contact with the side of the semiconductor pattern remote from the substrate.

In order to achieve the above function, a technology approach adapted in the present application is: providing a method of manufacturing an array substrate, including:

a substrate;

forming a first insulating layer on the substrate and disposing a source electrode pattern within the first insulating layer, wherein a side of the source electrode pattern remote from the substrate is at least partially exposed through the first insulating layer;

forming an annular gate electrode pattern on the first insulating layer wherein the annular gate electrode pattern surrounded the periphery of the source electrode pattern;

forming a second insulating layer on the annular gate electrode pattern, wherein a side of the source electrode pattern remote from the substrate is at least partially exposed through the second insulating layer;

forming a semiconductor pattern in the annular area of the annular gate electrode pattern, wherein the semiconductor pattern is electrically connected to the exposed portion of the source electrode pattern and the semiconductor pattern is electrical insulation to the annular gate electrode pattern through the second insulating layer;

forming a pixel electrode on the second insulating layer, wherein the pixel electrode is electrically connected to a side of the semiconductor pattern remote from the substrate.

Wherein the step to form the first insulating layer on the substrate and dispose the source electrode pattern within the first insulating layer including:

forming a buffer layer on the substrate and performing the patterning process to form a channel corresponding to the source electrode pattern and the data lines on the buffer layer;

forming a first conductive layer on the buffer layer and performing the patterning process to form a first source electrode pattern layer and the data line in the channel; and forming a passivation layer on the buffer layer and performing the patterning process to form an opening to partially expose the first source electrode pattern layer on the passivation layer.

Wherein the step to form the annular gate electrode pattern on the first insulating layer including: forming a second conductive layer on the passivation layer and performing the patterning process to form a second source electrode pattern layer within the opening and form the annular gate electrode pattern in the peripheral of the opening, wherein the first source electrode pattern layer and the second source electrode pattern layer are jointly as the source electrode pattern.

Wherein the step to form the second conductive layer on the passivation layer and performing the patterning process further including:

forming a scanning line and electrically connected to the annular gate electrode pattern.

The advantage of this application is: comparing to the conventional technology, the array substrate of the present application includes: a substrate; a first insulating layer disposed on the substrate; a source electrode pattern disposed within the first insulating layer; an annular gate electrode pattern disposed on the first insulating layer and surrounded the periphery of the source electrode pattern; a second insulating layer covering on the annular gate electrode pattern, wherein the source electrode pattern remote from the substrate is at least partially exposed through the first insulating layer and the second insulating layer; a semiconductor pattern disposed in the annular area of the annular gate electrode pattern, and is electrically connected to the exposed portion of the source electrode pattern, the semiconductor pattern is further electrical insulation to the annular gate electrode pattern through the second insulating layer; a pixel electrode disposed on the second insulating layer and electrically connected to a side of the semiconductor pattern remote from the substrate; comparing to the bottom gate structure is usually adapted in the conventional array substrate, the adaption of the annular gate electrode structure can increase the width to length ratio of the channel and increase the charging rate.

BRIEF DESCRIPTION OF THE DRAWINGS

In order to more clearly illustrate the embodiments of the present application or prior art, the following figures will be described in the embodiments are briefly introduced. It is obvious that the drawings are merely some embodiments of the present application, those of ordinary skill in this field can obtain other figures according to these figures without paying the premise.

DETAILED DESCRIPTION OF PREFERRED EMBODIMENTS

Embodiments of the present application are described in detail with the technical matters, structural features, achieved objects, and effects with reference to the accompanying drawings as follows. It is clear that the described embodiments are part of embodiments of the present application, but not all embodiments. Based on the embodiments of the present application, all other embodiments to those of ordinary skill in the premise of no creative efforts obtained should be considered within the scope of protection of the present application.

Specifically, the terminologies in the embodiments of the present application are merely for describing the purpose of the certain embodiment, but not to limit the invention. Examples and the claims be implemented in the present application requires the use of the singular form of the book "an", "the" and "the" are intend to include most forms unless the context clearly dictates otherwise. It should also be understood that the terminology used herein that "and/or" means and includes any or all possible combinations of one or more of the associated listed items.

Figure 1:
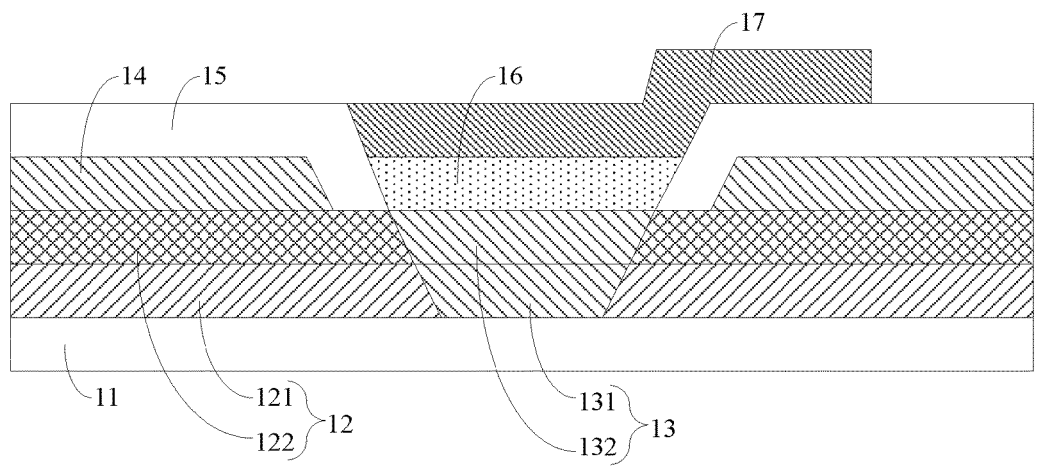
FIG. 1 is a schematic cross-sectional view of the array substrate according to a first embodiment of the present invention.

Referring to FIG. 1, FIG. 1 is a schematic cross-sectional view of the array substrate according to a first embodiment of the present invention. The array substrate disclosed in the present embodiment includes: a scanning line G, a data line D, a substrate 11, a first insulating layer 12, a source electrode pattern 13, a annular gate electrode pattern 14, a second insulating layer 15, a semiconductor pattern 16, and a pixel electrode 17.

Figure 10:
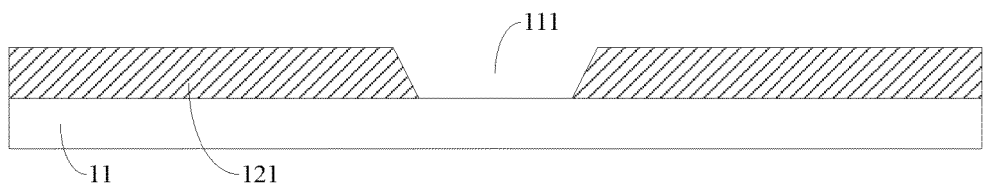
FIG. 10 is a schematic structure of manufacturing the buffer layer illustrated in FIG. 9.

Wherein, the substrate 11 is preferably a glass substrate. The first insulating layer 12 is disposed on the substrate 11, specifically, the first insulating layer 12 includes a buffer layer 121 and a passivation layer 122, the buffer layer 121 is formed on the substrate 11 by the process steps of CVD (Chemical Vapor Deposition)-photo (exposure)-Dry (dry etching)-Str(stripping). The buffer layer 121 defines a channel 111 (as shown in FIG. 10).

By the process steps of PVD (Physical Vapor Deposition)-photo (exposure)-Wet (wet etching)-Str, the data line D and the source electrode pattern 13 are formed on the substrate 11. Since the pattern of the buffer layer 121 and data line D is exactly the same, there is no need to have an additional mask in forming the data line D and the source electrode pattern 13.

Figure 2:
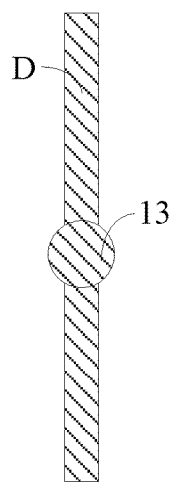
FIG. 2 is a schematic plan view of the data line and a source electrode pattern illustrated in FIG. 1.

In combination of illustrating in FIG. 2, the data line D is electrically connected to the source electrode pattern 13, the source electrode pattern 13 is formed in the channel 111 of the buffer 121, and the data line D is formed within the buffer layer 121, which can planarize the plane that the source electrode pattern 13, the data line D and the buffer layer 121 are formed.

Figure 3:
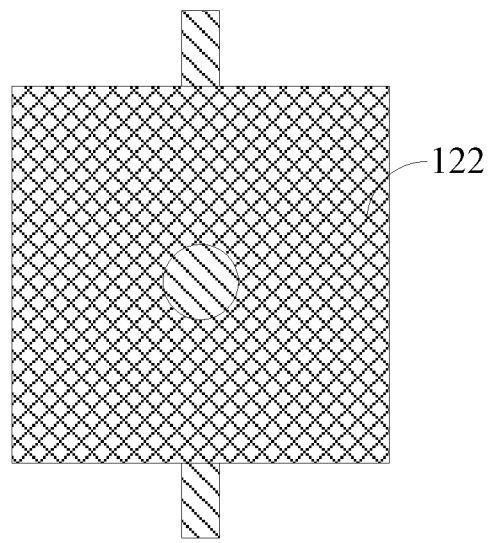
FIG. 3 is a schematic plan view of a passivation layer illustrated in FIG. 1.

By the process of CVD-Photo-Dry-Str, a passivation layer 122 is formed on the buffer layer 121, the data line D is covered by the passivation layer 122, as illustrated in FIG. 3.

Wherein, the source electrode pattern 13 includes a first source electrode pattern layer 131 and a second source electrode pattern layer 132 stacked on the first source electrode pattern layer 131. The first source electrode pattern layer 131 and the data line D is formed by the same material, the second source electrode pattern layer 132 and the annular gate electrode pattern 14 is formed by the same material. Preferably, the data line D and the annular gate electrode pattern 14 is formed by the same material.

The data line D and the first source electrode pattern layer 131 are formed on the substrate 11, the data line D is electrically connected to the first source electrode pattern layer 131, The first source electrode pattern layer 131 is formed in the channel 111 of the buffer layer 121 and the data line D are formed within the buffer layer 121. The passivation layer 122 covers the data line D, but does not cover the first source electrode pattern layer 131.

Figure 4:
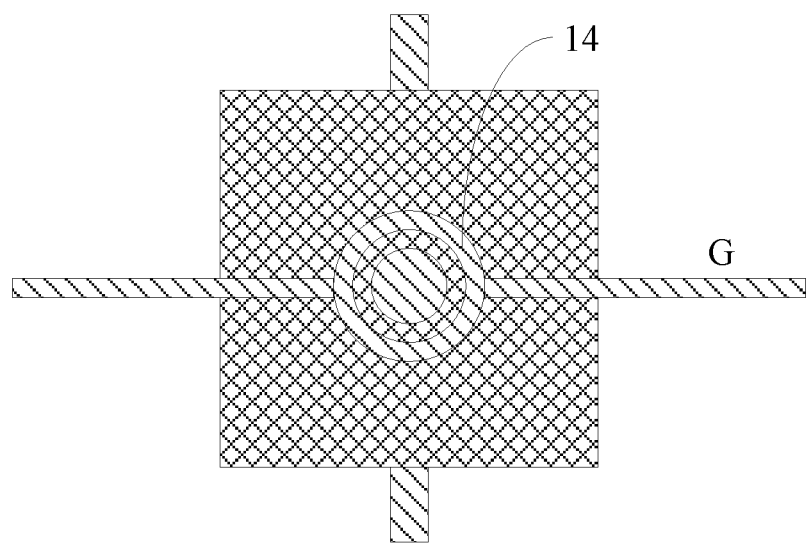
FIG. 4 is a schematic plan view of a scan line and the annular gate electrode pattern illustrated in FIG. 1.

By the process of PVD-Photo-Wet-Str, the scanning line G and the annular gate electrode pattern 14 are formed on the first insulating layer 12, i.e., the scanning line G and the annular gate electrode pattern 14 are formed on the passivation layer 122, the scanning line G is electrically connected to the annular gate electrode pattern 14. Wherein the annular gate electrode pattern 14 is disposed on the first insulating layer 12 and surrounds the peripheral of the source electrode pattern 13, i.e., the annular gate electrode pattern 14 surrounded the peripheral of the first source electrode pattern layer 131, as illustrated in FIG. 4.

When the scanning line G and the annular gate electrode pattern 14 are being formed on the first insulating layer 12, a second source electrode pattern layer 132 is formed on the first source electrode pattern layer 131.

Figure 5:
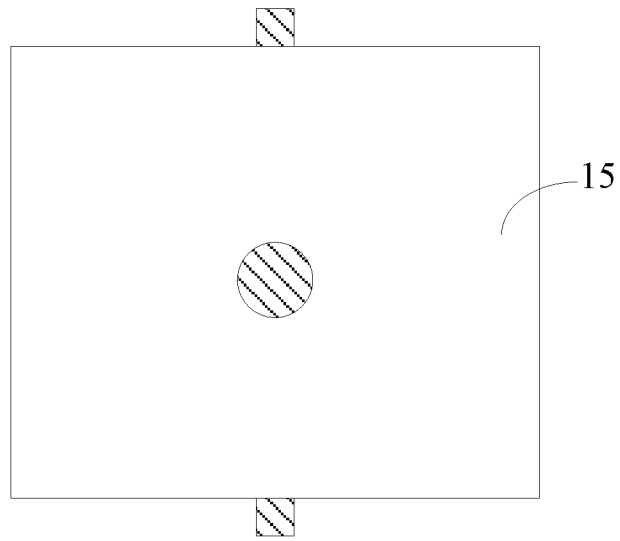
FIG. 5 is a schematic plan view of a second insulating layer illustrated in FIG. 1.
Figure 14:
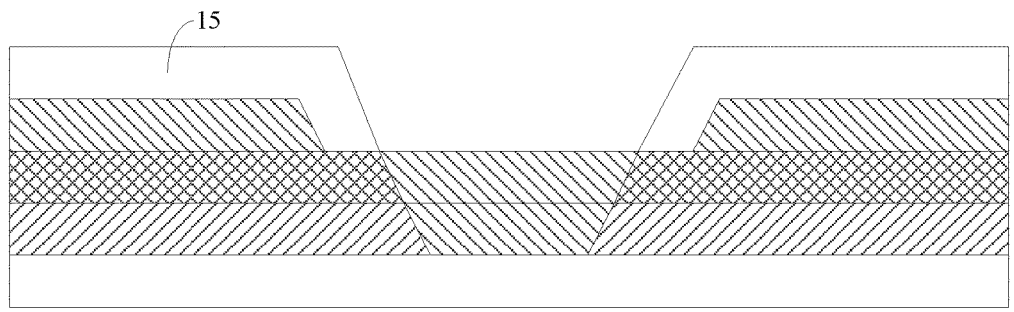
FIG. 14 is a schematic structure of manufacturing the second insulation layer illustrated in FIG. 9.

By the process of PVD-Photo-WET-Str, the second insulating layer 15 having an opening is formed (as shown in FIG. 14). The second insulating layer 15 covers on the annular gate electrode pattern 14 and the scanning line G, wherein the opening corresponds to the channel 111 of the first insulating layer 12, such that the side of the source electrode pattern 13 remote from the substrate 11, which is at least partially exposed through the first insulating layer 12 is at least partially exposed through the opening of the second insulating layer 15, i.e. the second source electrode pattern layer 132 is at least partially exposed through the channel 111 of first insulating layer 12 and the opening of the second insulating layer 15, as illustrated in FIG. 5.

Figure 6:
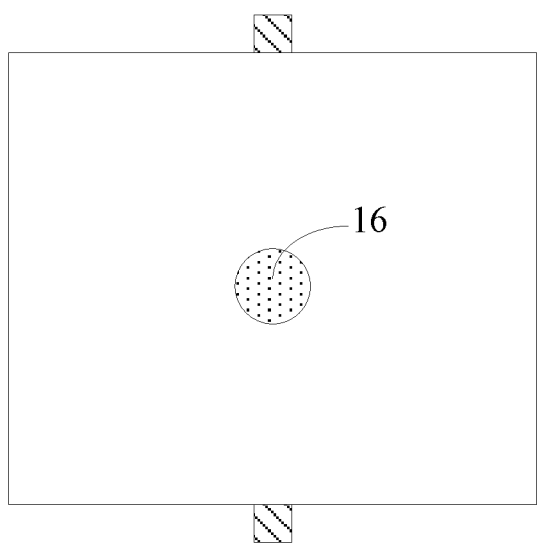
FIG. 6 is a schematic plan view of a semiconductor pattern illustrated in FIG. 1.

By the process of CVD-Photo-Dry-Str, the semiconductor pattern 16 is formed on the second source electrode pattern layer 132. Wherein the semiconductor pattern 16 is disposed in the annular area of the annular gate electrode pattern 14, and is electrically connected to the exposed portion of the source electrode pattern 13, the semiconductor pattern 16 is electrical insulated to the annular gate electrode pattern 14 by the second insulating layer 15, i.e., the semiconductor pattern 16 is electrically connected to the exposed portion of the second source electrode pattern layer 132, as illustrated in FIG. 6.

Specifically, the semiconductor pattern 16 is in direct contact with the exposed portion of the source electrode pattern 13, i.e., the semiconductor pattern 16 is in direct contact with the exposed portion of the second source electrode pattern layer 132.

Wherein the material of the semiconductor pattern 16 includes an amorphous silicon, indium gallium zinc oxide, IGZO, or polysilicon. The preferably material of the semiconductor pattern 16 of the present embodiment is amorphous silicon material, n+ amorphous silicon, i.e., the phosphorus-doped amorphous silicon, is formed directly by CVD process, without cutting the n+ amorphous silicon by the Dry process.

Figure 7:
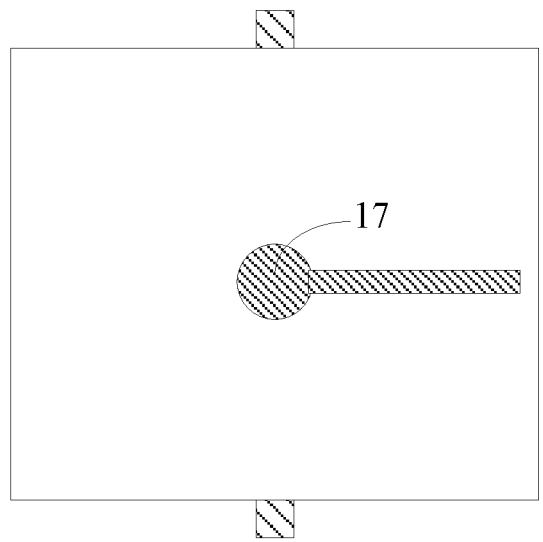
FIG. 7 is a schematic plan view of a pixel electrode illustrated in FIG. 1.

By the process of PVD-Photo-WET-Str, the pixel electrode 17 is formed on the semiconductor pattern 16. The pixel electrode 17 is disposed on the second insulating layer 15 and electrically connected to a side of the semiconductor pattern 16 remote from the substrate, as illustrated in FIG. 7. Wherein the pixel electrode 17 is in direct contact with the side of the semiconductor pattern 16 remote from the substrate.

Wherein, the pixel electrode 17 is preferably an Indium tin oxide, ITO electrode or MoTi electrode.

Figure 8:
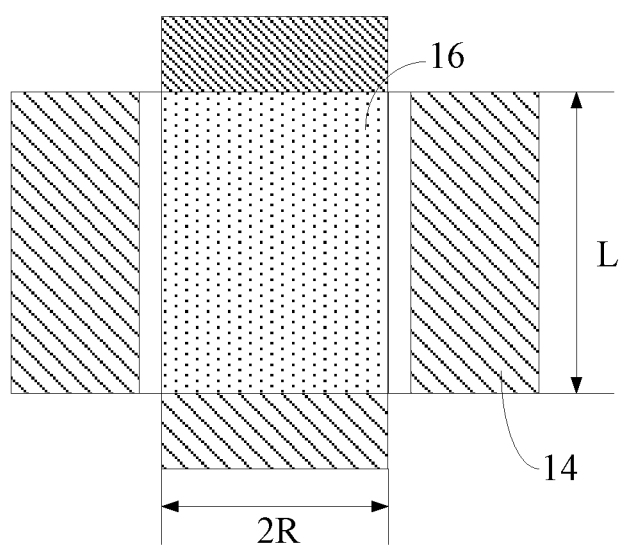
FIG. 8 is a schematic cross-sectional view of the annular gate electrode pattern illustrated in FIG. 1.

Further referring to FIG. 8, the thickness of the semiconductor pattern 16 is L, the radius is R, generally, the thickness L of the semiconductor pattern 16 is about 0.2 micrometer. For example, the radius R of the semiconductor pattern 16 is 4 micrometer, so that the channel of the annular gate electrode pattern 14 has the width to length ratio W/L=2πR/L=120. Therefore, the width to length ratio of the channel in array substrate disclosed in the present embodiment is greater than or equal to 120, comparing to the width to length ratio of the channel in the conventional technology, which is 1-10, the width to length ratio of the channel in the present embodiment can be increased, thereby increasing the on-state current, and increasing the charging rate.

Figure 9:
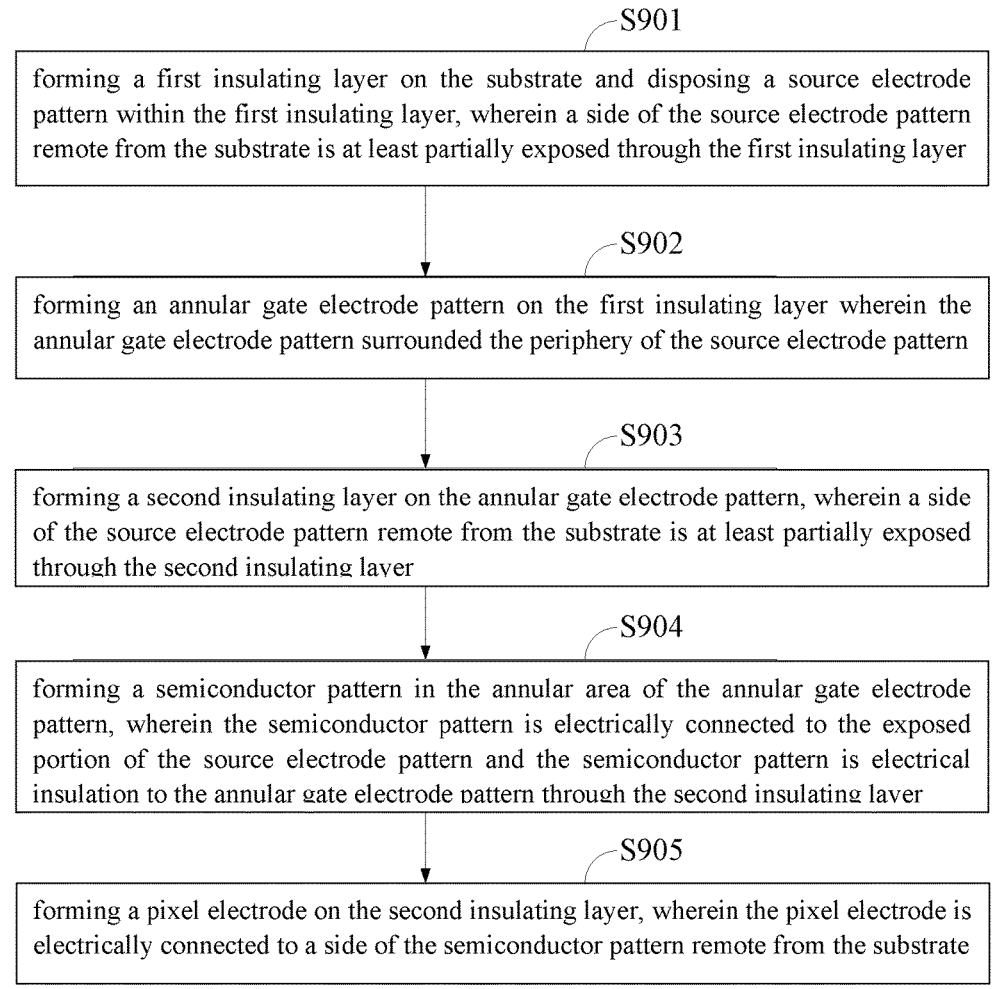
FIG. 9 is a schematic flow diagram of a method of manufacturing the array substrate according to the first embodiment of the present invention.

The present invention further provides a method of manufacturing the array substrate, the detail description is based on the array substrate disclosed in the first embodiment. As illustrated in FIG. 9, the method of manufacturing the array substrate disclosed in the embodiment includes the following steps:

Step S901: forming the first insulating layer 12 defining a channel 111 on the substrate 11 and disposing the source electrode pattern 13 in the channel 111 of the first insulating layer 12, such that a side of the source electrode pattern 13 remote from the substrate 11 is at least partially exposed through the channel 111 of the first insulating layer 12;

Step S902: forming the annular gate electrode pattern 14 on the first insulating layer 12, wherein the annular gate electrode pattern 14 surrounds the peripheral of the source electrode pattern 13;

Step S903: forming the second insulating layer 15 on the annular gate electrode pattern 14, wherein the second insulating layer 15 define an opening corresponding to the channel 111 such that the side of the source electrode pattern 13 remote from the substrate 11 is at least partially exposed through the channel of the first insulating layer 12 and the opening of the second insulating layer 15.

Step S904: forming the semiconductor pattern 16 in the annular area of the annular gate electrode pattern 14, wherein the semiconductor pattern 16 is electrically connected to the exposed portion of the source electrode pattern 13, and is electrically insulated to the annular gate electrode pattern 14 through by the second insulating layer 15.

Step S905: forming the pixel electrode 17 on the second insulating layer 15, wherein the pixel electrode 17 is electrically connected to a side of the semiconductor pattern 16 remote from the substrate 11.

In step S901, the substrate 11 is preferably a glass substrate. The buffer layer 121 is formed on the substrate 11, and the patterning process is performed on the buffer layer 121, so as to form the channel 111 corresponding to the source electrode pattern 13 and the data lines D in the buffer layer 121, as illustrated in FIG. 10.

Figure 11:
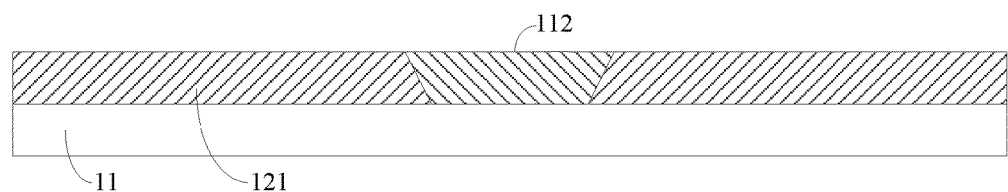
FIG. 11 is a schematic structure of manufacturing the first source electrode pattern layer and the data line illustrated in FIG. 9.
Figure 12:
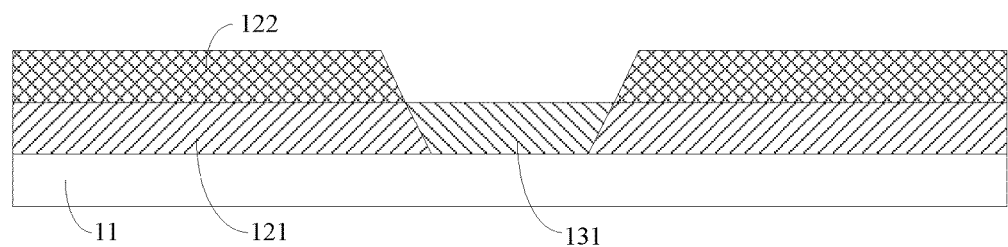
FIG. 12 is a schematic structure of manufacturing the passivation layer illustrated in FIG. 9.

A first conductive layer 112 is formed on the buffer layer 11, and the patterning process is performed on the first conductive layer 112 to form the first source electrode pattern layer 131 and the data line D in the channel 111, as illustrated in FIG. 11;

The passivation layer 122 is formed on the buffer layer 11. The patterning process is performed to form an channel 111, such that the first source electrode pattern layer is partially exposed through the channel 111 the passivation layer 122, as illustrated in FIG. 12.

Figure 13:
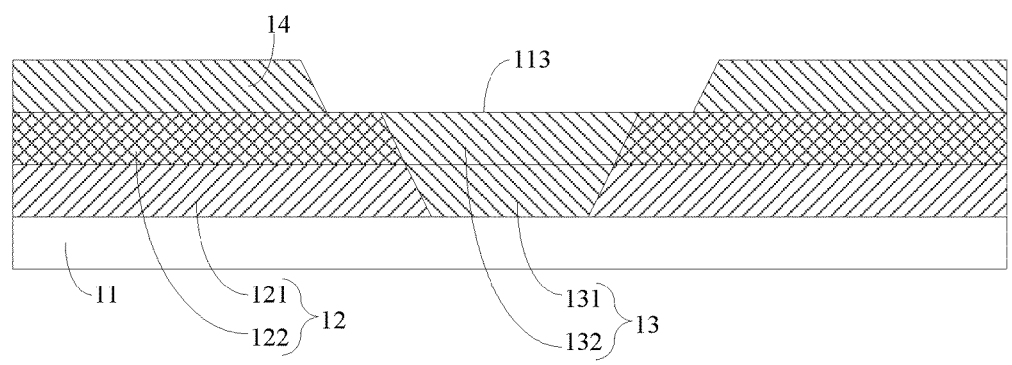
FIG. 13 is a schematic structure of manufacturing the second source electrode pattern layer and the annular gate electrode pattern illustrated in FIG. 9.

In the step S902, the second conductive layer 113 is formed on the passivation layer 122, and the patterning process is performed on the second conductive layer 113 to form the second source electrode pattern layer 132 in the opening and form the annular gate electrode pattern 14 surrounding the peripheral of the opening, wherein the first source electrode pattern layer 131 and the second source electrode pattern layer 132 are jointly act as the source electrode pattern 13, as illustrated in FIG. 13.

Furthermore, the scanning line G is formed on the passivation layer 122 and is electrically connected to the annular gate electrode pattern 14.

In step S903, as illustrated in FIG. 14, the second insulating layer 15 defining the opening covers on the annular gate electrode pattern 14 and the scanning lines G, wherein the exposed portion of the source electrode pattern 13 remote from the substrate 11 is at least partially exposed through the channel 111 of the first insulating layer 12 and the opening of the second insulating layer 15, i.e. the second source electrode pattern layer 132 is at least partially exposed through the channel 111 of the first insulating layer 12 and the opening of the second insulating layer 15, as illustrated in FIG. 5.

Figure 15:
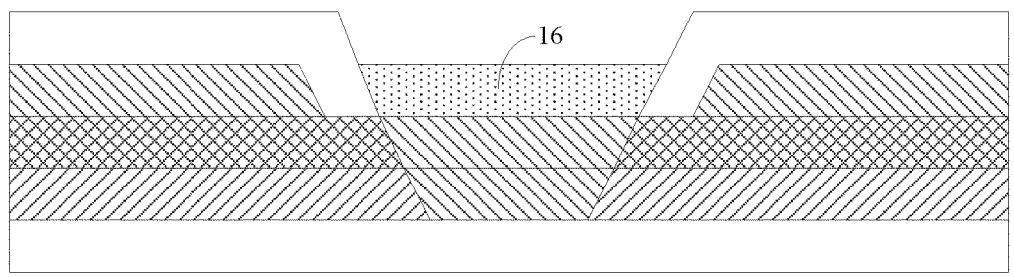
FIG. 15 is a schematic structure of manufacturing the semiconductor pattern illustrated in FIG. 9.

In step S904, the semiconductor pattern 16 is formed on the second source electrode pattern layer 132, as illustrated in FIG. 15. Wherein the semiconductor pattern 16 is disposed in the annular area of the annular gate electrode pattern 14, and is electrically connected to the exposed portion of the source electrode pattern 13, the semiconductor pattern 16 is further electrical insulation to the annular gate electrode pattern 14 through the second insulating layer 15, i.e., the semiconductor pattern 16 is electrically connected to the exposed portion of the second source electrode pattern layer 132, as illustrated in FIG. 6. Specifically, the semiconductor pattern 16 is in direct contact with the exposed portion of the source electrode pattern 13, i.e., the semiconductor pattern 16 is in direct contact with the exposed portion of the second source electrode pattern layer 132.

Figure 16:
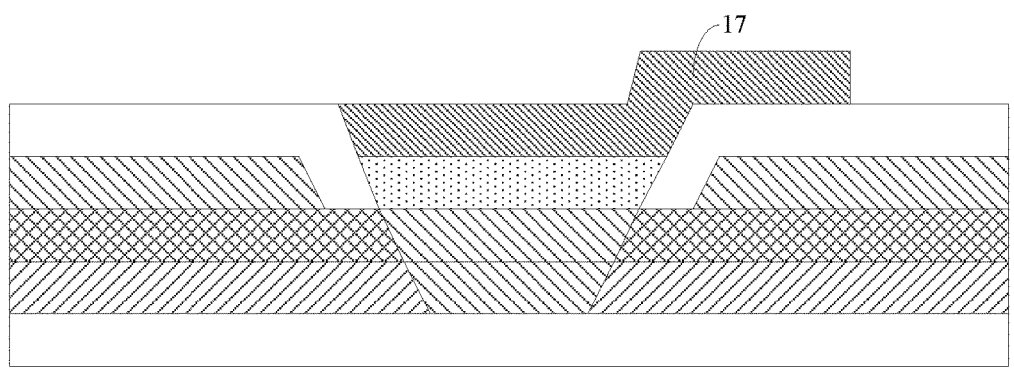
FIG. 16 is a schematic structure of manufacturing the pixel electrode illustrated in FIG. 9.

In step S905, the pixel electrode 17 is formed on the semiconductor pattern 16, as illustrated in FIG. 16. The pixel electrode 17 is disposed on the second insulating layer 15 and electrically connected to a side of the semiconductor pattern 16 remote from the substrate, as illustrated in FIG. 7. Wherein the pixel electrode 17 is in direct contact with the side of the semiconductor pattern 16 remote from the substrate.

As illustrated in FIG. 8, the thickness of the semiconductor pattern 16 is L, the radius is R, generally, the thickness L of the semiconductor pattern 16 is about 0.2 micrometer. For example, the radius R of the semiconductor pattern 16 is 4 micrometer, so that the channel of the annular gate electrode pattern 14 has the width to length ratio $W/L=2\pi R/L=120$. Therefore, the width to length ratio of the channel in array substrate disclosed in the present embodiment is greater than or equal to 120, comparing to the width to length ratio of the channel in the conventional technology, which is 1-10, the width to length ratio of the channel in the present embodiment can be increased, thereby increasing the on-state current, and increasing the charging rate.

Figure 17:
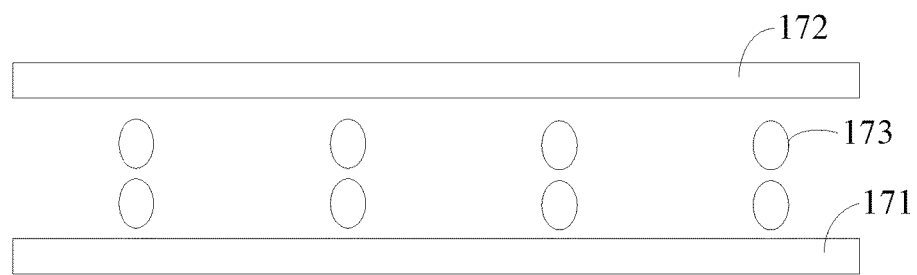
FIG. 17 is a schematic structure of the display panel according to the first embodiment of the present invention.

The present invention also provides a display panel 170, as illustrated in FIG. 17, the display panel 170 discloses in the present embodiment includes an array substrate 171, a color filter substrate 172 and a liquid crystal layer 173 are disposed between the array substrate 171 and the color filter substrate 172, the array substrate 171 disclosed in the embodiment is the array substrate described in the above embodiments, and is not described here.

In summary, the array substrate of the present invention includes: a substrate; a first insulating layer disposed on the substrate; a source electrode pattern disposed within the first insulating layer; an annular gate electrode pattern disposed on the first insulating layer and surrounded the periphery of the source electrode pattern; a second insulating layer covering on the annular gate electrode pattern, wherein the source electrode pattern remote from the substrate is at least partially exposed through the first insulating layer and the second insulating layer; a semiconductor pattern disposed in the annular area of the annular gate electrode pattern, and is electrically connected to the exposed portion of the source electrode pattern, the semiconductor pattern is further electrically insulated to the annular gate electrode pattern through the second insulating layer; a pixel electrode disposed on the second insulating layer and electrically connected to a side of the semiconductor pattern remote from the substrate; comparing to the bottom gate structure usually adapted in the conventional array substrate, the adaption of the annular gate electrode structure can increase the width to length ratio of the channel and increase the charging rate.

Above are embodiments of the present application, which does not limit the scope of the present application. Any modifications, equivalent replacements or improvements within the spirit and principles of the embodiment described above should be covered by the protected scope of the invention.

What is claimed is:

1. An array substrate, comprising: a substrate; a first insulating layer disposed on the substrate, wherein the first insulating layer defines a channel; a source electrode pattern disposed in the channel of the first insulating layer; an annular gate electrode pattern disposed on the first insulating layer and surrounding the periphery of the source electrode pattern; a second insulating layer covering the annular gate electrode pattern, wherein the second insulating layer defines an opening corresponding to the channel of the first insulating layer, such that a face of the source electrode pattern away from the substrate is at least partially accessible through the channel of the first insulating layer and the opening of the second insulating layer; a semiconductor pattern disposed in the annular area of the annular gate electrode pattern, and is electrically connected to the accessible face of the source electrode pattern, the semiconductor pattern is further electrically insulated from the annular gate electrode pattern by the second insulating layer; a pixel electrode disposed on the second insulating layer and electrically connected to a face of the semiconductor pattern away from the substrate;

a data line electrically connected to the source electrode pattern, wherein the first insulating layer comprising a buffer layer and a passivation layer, the data line is formed within the buffer layer and covered by the passivation layer; and wherein the source electrode pattern comprises a first source electrode pattern layer and a second source electrode pattern layer disposed stacked together, the first source electrode pattern layer and the data line are formed by the same material, the second source electrode pattern layer and the annular gate electrode pattern are formed by the same material.

2. The array substrate according to claim 1, wherein the array substrate further comprises a scanning line electrically connected to the annular gate electrode pattern, and the second insulating layer further covering the scanning line.

3. The array substrate according to claim 1, wherein the semiconductor pattern is in direct contact with the exposed accessible face of the source electrode pattern.

4. The array substrate according to claim 1, wherein the pixel electrode is in direct contact with the face of the semiconductor pattern remote from the substrate.

5. An array substrate, comprising: a substrate; a first insulating layer disposed on the substrate, wherein the first insulating layer defines a channel; a source electrode pattern disposed in the channel of the first insulating layer; an annular gate electrode pattern disposed on the first insulating layer and surrounding the periphery of the source electrode pattern; a second insulating layer covering the annular gate electrode pattern, wherein the second insulating layer defines an opening corresponding to the channel of the first insulating layer, such that a face of the source electrode pattern away from the substrate is at least partially accessible through the channel of the first insulating layer and the opening of the second insulating layer; a semiconductor pattern disposed in the annular area of the annular gate electrode pattern, and is electrically connected to the accessible face of the source electrode pattern, the semiconductor pattern is further electrically insulated from the annular gate electrode pattern by the second insulating layer; and a pixel electrode disposed on the second insulating layer and electrically connected to a face of the semiconductor pattern remote from the substrate; and wherein the source electrode pattern comprises a first source electrode pattern layer and a second source electrode pattern layer stacked together, the first source electrode pattern layer and the data line are formed by the same material, the second source electrode pattern layer and the annular gate electrode pattern are formed by the same material.

6. The array substrate according to claim 5, wherein the array substrate further comprises a data line electrically connected to the source electrode pattern, wherein the first insulating layer comprising a buffer layer and a passivation layer, the data line is formed within the buffer layer and covered by the passivation layer.

7. The array substrate according to claim 5, wherein the array substrate further comprises a scanning line electrically connected to the annular gate electrode pattern, and the second insulating layer further covering the scanning line.

8. The array substrate according to claim 5, wherein the semiconductor pattern is in direct contact with the accessible face of the source electrode pattern.

9. The array substrate according to claim 5, wherein the pixel electrode is in direct contact with the face of the semiconductor pattern remote from the substrate.

* * * * *